(12) United States Patent
Hasegawa et al.

(10) Patent No.: US 8,900,336 B2
(45) Date of Patent: Dec. 2, 2014

(54) CUTTING TOOL

(75) Inventors: Mitsuru Hasegawa, Satsumasendai (JP); Masahiro Waki, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 149 days.

(21) Appl. No.: 13/637,335

(22) PCT Filed: Mar. 25, 2011

(86) PCT No.: PCT/JP2011/057387
§ 371 (c)(1),
(2), (4) Date: Sep. 27, 2012

(87) PCT Pub. No.: WO2011/118782
PCT Pub. Date: Sep. 29, 2011

(65) Prior Publication Data
US 2013/0017026 A1 Jan. 17, 2013

(30) Foreign Application Priority Data
Mar. 25, 2010 (JP) .................. 2010-070397

(51) Int. Cl.
C23C 14/00 (2006.01)
C23C 14/06 (2006.01)
C23C 30/00 (2006.01)
C23C 14/34 (2006.01)
C23C 28/04 (2006.01)
C23C 28/00 (2006.01)

(52) U.S. Cl.
CPC ........... C23C 14/0664 (2013.01); C23C 30/005 (2013.01); C23C 14/0641 (2013.01); C23C 14/345 (2013.01); C23C 14/3464 (2013.01); C23C 28/044 (2013.01); C23C 28/042 (2013.01); C23C 28/42 (2013.01)
USPC ............... 51/307; 51/309; 428/216; 428/325; 428/697; 428/698; 428/699

(58) Field of Classification Search
CPC .................... C23C 14/0664; C23C 30/005
USPC ........... 51/307, 309; 428/216, 325, 697, 698, 428/699
See application file for complete search history.

(56) References Cited

U.S. PATENT DOCUMENTS

| | | | | |
|---|---|---|---|---|
| 7,811,683 | B2 * | 10/2010 | Zhu et al. ...................... | 428/472 |
| 8,062,776 | B2 * | 11/2011 | Waki et al. ...................... | 51/309 |
| 8,097,332 | B2 * | 1/2012 | Omori et al. ..................... | 51/307 |
| 8,236,411 | B2 * | 8/2012 | Waki et al. ..................... | 428/699 |
| 8,586,214 | B2 * | 11/2013 | Sakamoto et al. ............ | 428/698 |
| 8,623,525 | B2 * | 1/2014 | Waki et al. ..................... | 428/697 |
| 8,691,366 | B2 * | 4/2014 | Waki et al. ..................... | 428/148 |
| 2008/0075854 | A1 | 3/2008 | Stirniman et al. | |

FOREIGN PATENT DOCUMENTS

| | | | |
|---|---|---|---|
| JP | 05-337705 | * | 12/1993 |
| JP | 2005-337705 | | 12/1993 |
| JP | 2011-61380 | | 3/1999 |
| JP | 2006-111915 | | 4/2006 |
| JP | 2008-264975 | | 11/2008 |
| JP | 2008-296290 | * | 12/2008 |
| JP | 2009-50997 | | 3/2009 |
| JP | 2009-066673 | * | 4/2009 |

* cited by examiner

*Primary Examiner* — Archene Turner

(57) ABSTRACT

A cutting tool in which wear resistance is improved by suppressing sudden chipping on the flank face while suppressing oxidation of the coating layer on the rake face, and thereby has a long lifespan even under cutting conditions in which deposition and edge damage easily occur. In the cutting tool, a coating layer represented by $Ti_{1-a-b-c}Al_a W_b M_c(C_{1-x}N_x)$, with M selected as at least one of silicon, yttrium, and a metal belonging to group 4, 5, or 6 on the periodic table, excluding titanium and tungsten, and $0.3 \leq a \leq 0.6$, $0.01 \leq b \leq 0.2$, $0 \leq c \leq 0.2$, and $0 \leq x \leq 1$, being provided on the surface of a main cutting tool body having a flank face and a rake face, and the content ratio of tungsten on the flank face is higher than the content ratio of tungsten on the rake face.

6 Claims, No Drawings

CUTTING TOOL

TECHNICAL FIELD

The present invention relates to a cutting tool in which a coating layer is formed on a surface of a substrate.

BACKGROUND OF THE INVENTION

Cutting tools need to have wear resistance, welding resistance, and chipping resistance. Therefore, cutting tools in which coating layers formed on a surfaces of hard substrates such as WC-based cemented carbide or TiCN-based cermet are widely used.

In general, TiCN layers and TiAlN layers are widely used as such coating layers. Various coating layers are under development for the purpose of achieving higher wear resistance and enhanced chipping resistance.

For example, Patent Literature 1 discloses a (TiWSi)N coating layer, which has increased adhesion with a substrate. Patent Literature 2 discloses a (Ti, Al, W, Si, M (M is at least one selected from the group consisting of Nb, Mo, Ta, Hf, and Y))N coating layer, which has good oxidation resistance and chipping resistance.

CITATION LIST

Patent Literature

PTL 1: Japanese Unexamined Patent Application Publication No. 2006-111915
PTL 2: Japanese Unexamined Patent Application Publication No. 2009-050997

However, even though a coating layer containing Ti, Al, and/or W is formed on a surface of a substrate as disclosed in Patent Literature 1 or 2, the wear resistance and the chipping resistance are not necessarily sufficient. Therefore, further enhanced wear resistance and chipping resistance have been desired. A flank face and a rake face are slightly different in required performance from each other and therefore each need to be optimized in performance.

Accordingly, it is an object of the present invention to provide a cutting tool including a coating layer capable of optimizing the cutting performance of each of a rake face and a flank face.

SUMMARY OF THE INVENTION

According to a cutting tool of the present invention, a coating layer is formed on a surface of a cutting tool substrate which includes a rake face and a flank face. The coating layer is represented by $Ti_{1-a-b-c}Al_aW_bM_c(C_{1-x}N_x)$ (where M is at least one selected from the group consisting of Si, Y, Group-IV, V, and VI metals, excluding Ti and W, in the periodic table; $0.3 \le a \le 0.6$; $0.01 \le b \le 0.2$; $0 \le c \le 0.2$; and $0 \le x \le 1$), and a content ratio of W at the flank face is more than the content ratio of W at the rake face.

DETAILED DESCRIPTION OF THE INVENTION

Herein, $W_f/W_r$ is preferably 1.5 to 3.2, where $W_r$ is a ratio of an amount of W to a total amount of Ti and Al in the coating layer at the rake face and $W_f$ is the ratio of the amount of W to the total amount of Ti and Al in the coating layer at the flank face. $Al_r/Al_f$ is preferably 1.03 to 1.1, where $Al_r$ is a ratio of an amount of Al to the total amount of Ti and Al in the coating layer at the rake face and $Al_f$ is the ratio of the amount of Al to the total amount of Ti and Al in the coating layer at the flank face.

The thickness of the coating layer at the flank face is preferably larger than the thickness of the coating layer at the rake face.

Furthermore, droplets are preferably present on a surface of the coating layer. The content ratio of W in the droplets at the flank face is preferably less than the content ratio of W in the droplets at the rake face.

The coating layer may have a configuration in which first coating layers represented by $Ti_{1-a1-b1-c1}Al_{a1}W_{b1}M_{c1}(C_{1-x1}N_{x1})$ (where $0 \le a1 \le 0.8$, $0 \le 1 \le 0.2$, $0 \le c1 \le 0.2$, $0 \le x1 \le 1$) and second coating layers represented by $Ti_{1-a2-b2-c2}Al_{a2}W_{b2}M_{c2}(C_{1-x2}N_{x2})$ (where $0 \le a2 \le 0.8$, $0 \le b2 \le 0.2$, $0 \le c2 \le 0.2$, and $0 \le x2 \le 1$, a1=a2, b1=b2, and c1=c2 being excluded) are alternately stacked, the number of the first and second coating layers being ten or more.

Furthermore, the second coating layers may be represented by $Ti_{1-a2}Al_{a2}(C_{1-x2}N_{x2})$ (where $0.3 \le a2 \le 0.8$ and $0 \le x2 \le 1$).

Advantageous Effects of Invention

According to a cutting tool of the present invention, with a composition having a content of W in a coating layer having a predetermined composition range at a flank face more than that at a rake face, the coating layer at the rake face has high oxidation resistance and therefore the progress of wear due to the welding or oxidation of chips can be suppressed. The coating layer at the flank face has high chipping resistance; hence, a smooth machined surface can be formed and the wear of the flank face due to chipping can be suppressed. This enables cutting with good wear resistance and welding resistance under severe cutting conditions, such as the machining of difficult-to-cut materials, and allows a smooth dullness-free machined surface to be achieved.

In the above configuration, $W_f/W_r$ is preferably 1.5 to 3.2 in order to enhance the welding resistance of the rake face and in order to suppress the roughing of a cut surface due to chipping at the flank face, where $W_r$ is the ratio of the amount of W to the total amount of Ti and Al in the coating layer at the rake face and $W_f$ is the ratio of the amount of W to the total amount of Ti and Al in the coating layer at the flank face. $Al_r/Al_f$ is preferably 1.03 to 1.1 in order to optimize the balance between wear resistance and chipping resistance required for the rake face and the flank face, where $Al_r$ is the ratio of the amount of Al to the total amount of Ti and Al in the coating layer at the rake face and $Al_f$ is the ratio of the amount of Al to the total amount of Ti and Al in the coating layer at the flank face.

Furthermore, in this configuration, in order to suppress the welding of chips to the rake face and in order to improve the chipping resistance of the flank face, it is preferred that droplets be present on a surface of the coating layer and the content ratio of W in the droplets at the flank face be less than the content ratio of W in the droplets at the rake face.

DESCRIPTION OF EMBODIMENTS

In a cutting tool according to the present invention, a coating layer is formed on a surface of a cutting tool substrate having a rake face and a flank face. The coating layer is composed of $Ti_{1-a-b-c}Al_aW_bM_c(C_{1-x}N_x)$ (where M is at least one selected from the group consisting of Si, Y, Group-IV, V, and VI metals, excluding Ti and W, in the periodic table; $0.3 \le a \le 0.6$; $0.01 \le b \le 0.2$; $0 \le c \le 0.2$; and $0 \le x \le 1$).

Herein, when a is less than 0.3, hardness properties or oxidation resistance is not obtained. In contrast, when a is greater than 0.6, a reduction in hardness is significant due to cubic-to-hexagonal transformation. When b is less than 0.01, the toughness is low. In contrast, when b is greater than 0.2, a reduction in hardness is significant. Furthermore, when c is greater than 0.2, the coefficient of friction is large and no welding resistance is obtained.

The coating layer is configured such that the content ratio of tungsten (W) at the flank face is more than the content ratio of tungsten (W) at the rake face. This allows the coating layer at the rake face to have high oxidation resistance and to suppress the progress of wear due to the welding or oxidation of chips; the coating layer at the flank face to have high chipping resistance, to form a smooth machined surface during cutting, and to suppress the progress of wear due to chipping; and therefore the cutting tool to have a long lifetime and to form a smooth machined surface under cutting conditions likely to cause welding or chipping.

In the above configuration, $W_f/W_r$ is preferably 1.5 to 3.2 in order to enhance the welding resistance of the rake face and the chipping resistance of the flank face, where $W_r$ is the ratio of the amount of W to the total amount of Ti and Al in the coating layer at the rake face and $W_f$ is the ratio of the amount of W to the total amount of Ti and Al in the coating layer at the flank face. Furthermore, $Al_r/Al_f$ is preferably 1.03 to 1.1 in order to optimize the balance between wear resistance and chipping resistance required for the rake face and the flank face, where $Al_r$ is the ratio of the amount of Al to the total amount of Ti and Al in the coating layer at the rake face and $Al_f$ is the ratio of the amount of Al to the total amount of Ti and Al in the coating layer at the flank face.

The content ratio of each element in the coating layer can be measured with an energy dispersive X-ray spectroscopy (EDS) system equipped with a transmission electron microscope. The content ratio of Ti in the coating layer can be calculated from the proportion of the peak intensity of Ti element to the sum of the peak intensities of each of the elements. In energy dispersive X-ray spectroscopy (EDS) analysis, the peak (an energy of about 0.4 keV) of the Ti Lα line overlaps with the peak of the Kα line of N element, and therefore cannot be precisely measured. Therefore, in the case where N may possibly be contained, the peak thereof is excluded from peaks used for calculation; the content of Ti is determined using the peak (an energy of about 4.5 keV) of the Ti Kα line; $W_r$, $W_f$, $Al_r$, and $Al_f$ are calculated from the content thereof; and the proportions $W_f/W_r$ and $Al_r/Al_f$ are determined. According to the present invention, in the measurement of $Al_r$ and $Al_f$, measurements obtained from arbitrary five or more portions of the coating layer are averaged.

In the above configuration, the thickness of the coating layer at the flank face is preferably larger than the thickness of the coating layer at the rake face in order to achieve enhanced chipping resistance. The proportion $t_r/t_f$ preferably ranges from 0.45 to 0.85, where $t_r$ is the thickness of the coating layer at the rake face and $t_f$ is the thickness of the coating layer at the flank face.

In this configuration, in view of the balance between the suppression of the welding of chips to the rake face and the suppression of the chipping of the flank face, it is preferred that droplets be present on a surface of the coating layer and the content of W in the droplets at the flank face be less than the content of W in the droplets at the rake face.

The coating layer preferably has a multilayer structure in which first coating layers represented by $Ti_{1-a1-b1-c1}Al_{a1}W_{b1}M_{c1}(C_{1-x1}N_{x1})$ and second coating layers represented by $Ti_{1-a2-b2-c2}Al_{a2}W_{b2}M_{c2}(C_{1-x2}N_{x2})$ are alternately stacked, the number of the first and second coating layers being ten or more, where $0 \leq a1 \leq 0.8$, $0 \leq b1 \leq 0.2$, $0 \leq c1 \leq 0.2$, $0 \leq x1 \leq 1$, $0 \leq a2 \leq 0.8$, $0 \leq b2 \leq 0.2$, $0 \leq c2 \leq 0.2$, and $0 \leq x2 \leq 1$, but not a1=a2, b1=b2, and c1=c2. This allows the coating layer to have increased hardness and low internal stress; hence, even if the coating layer is thick, the coating layer is not chipped or peeled off.

In this case, the coating layer has increased hardness and enhanced wear resistance when, in particular, the second coating layers are represented by $Ti_{1-a2}Al_{a2}(C_{1-x2}N_{x2})$, where $0.3 \leq a2 \leq 0.8$ and $0 \leq x2 \leq 1$.

C and N are non-metal components of the coating layer and are necessary for the cutting tool to have good hardness and toughness. In order to suppress the excessive generation of the droplets on the coating layer surface, x (the content ratio of N) is particularly preferably within the range $0 \leq x \leq 0.5$. The composition of the coating layer can be measured energy dispersive X-ray spectroscopy (EDS) analysis or X-ray photoelectron spectroscopy (XPS).

The substrate is preferably made of a hard material such as cemented carbide and cermet having a hard phase made of tungsten carbide or titanium carbonitride as a main component and a bonding phase made of an iron-group metal such as cobalt or nickel, ceramic made of silicon nitride or aluminum oxide as a main component, or an ultra-high-pressure sintered body obtained by firing a hard phase made of polycrystalline diamond or cubic boron nitride and a bonding phase made of ceramic or an iron-group metal at high pressure.

(Manufacturing Method)

A method for manufacturing a surface-coated cutting tool according to the present invention will now be described.

First, a substrate having a tool shape is prepared by a known process. Next, a coating layer is formed on a surface of the substrate. A physical vapor deposition (PVD) process such as an ion plating process or a sputtering process can be preferably applied to a deposition process for forming the coating layer. An example of a procedure for forming the coating layer is described below in detail. In the case of forming the coating layer by the ion plating process, the following targets or target is used: metal targets independently containing metallic titanium (Ti), metallic aluminum (Al), and metallic tungsten (W) or metallic M (M is one or more selected from the group consisting of Si, Y, Group-IV, V, and VI elements, excluding Ti and W, in the periodic table) as required; or an alloy target prepared by combining these metals.

In this case, according to the present invention, a target containing metallic W or a compound thereof is prepared together with sintered targets containing the above metals, deposition is performed under deposition conditions below in such a manner that the W target is set at a position on an upper wall of a chamber and the other metal targets or alloy target is set at a position on a side wall of the chamber, whereby the coating layer formed can have a composition as specified herein. The target containing metallic W or the compound thereof may further contain another metal component such as Ti. As for a process for preparing a target, the use of an alloy target prepared by melting and then re-solidifying metal components tends to allow droplets deposited on a surface of the coating layer to have a composition in which a rake face is higher in W (tungsten) than a flank face as compared to the use of a sintered target prepared by mixing and then sintering metal powders.

As for deposition conditions, the coating layer is formed by an ion plating process in which a metal source is vaporized and ionized by arc discharge or glow discharge using this target, concurrently reacting with a nitrogen ($N_2$) gas serving as a nitrogen source and a methane ($CH_4$)/acetylene ($C_2H_2$) gas serving as a carbon source, or a sputtering process. In this case, the substrate is set such that the flank face is substantially parallel to an upper wall of the chamber and the rake face is substantially parallel to a side wall of the chamber.

In the case of forming the coating layer by the ion plating process or the sputtering process, a bias voltage of 30 V to 200 V is preferably applied to the substrate in consideration of the crystal structure of the coating layer because the coating layer can be prepared so as to have high hardness and high adhesion to the substrate.

The multilayer structure of the coating layer can be formed in such a manner that two composition targets, that is, a first target having a composition close to the composition of first coating layers and a second target having a composition close to the composition of second coating layers are attached to a side wall of a deposition apparatus, the W target is attached to the upper wall of the chamber so as to be located at a position close to the position of the first or second target, and deposition is performed with a sample rotated in the system.

Example 1

To a tungsten carbide (WC) powder having an average particle size of 0.5 μm, 10% by mass of a metallic cobalt (Co) powder and 0.8% by mass of a chromium carbide ($Cr_3C_2$) powder were added, followed by mixing. The mixture was formed into throw-away cutting tool (CNMG0408) insert forms to be sintered. After being subjected to a grinding step, each form was surface-cleaned with an alkali, an acid, and distilled water in that order, whereby a cutting insert substrate was prepared.

A coating layer shown in Table 1 was formed at a bias voltage shown in Table 1 in such a manner that the substrate was set in an arc ion plating apparatus equipped with targets shown in Table 1 and was heated to 500° C. Main targets used were sintered targets prepared by mixing and then sintering metal powders by a sintering process. Three of the main targets were set on a side wall of the chamber. Sub-targets used were sintered targets or alloy targets prepared by melting and then re-solidifying metals shown in Table 1. One of the sub-targets was set at a set position on a wall of the chamber as shown in Table 1. Deposition conditions includes an atmosphere, supplied with a nitrogen gas, having a total pressure of 4 Pa and an arc current of 150 A.

TABLE 1

| Sample No. | Targets Main target[1] | Sub-target | Set position | Deposition Condition Bias voltage (V) |
|---|---|---|---|---|
| I-1 | TiAlW | W (Alloy) | Lower wall | 50 |
| I-2 | TiAlNbSi | TiW (Alloy) | Upper wall | 35 |
| I-3 | TiAlSi | TiW (Sintered) | Lower wall | 120 |
| I-4 | TiAlMo | W (Alloy) | Lower wall | 40 |
| I-5 | TiAlCr | TiW (Alloy) | Lower wall | 100 |
| I-6 | TiAl | W (Sintered) | Lower wall | 70 |
| I-7 | TiAlNbW | TiW (Alloy) | Side wall | 50 |
| I-8 | TiAl | Ti (Alloy) | Lower wall | 60 |
| I-9 | TiAlW | — | | 100 |

[1]All main targets are set on a side wall of a chamber.

Obtained inserts were observed for structure at 50,000× magnification using a scanning electron microscope (VE 8800) manufactured by Keyence Corporation, whereby the shape of crystals forming each coating layer and the thicknesses ($t_r$, $t_f$ on the rake face and the flank face, respectively) were confirmed. Furthermore, a quantitative analysis of the coating layer was performed at an acceleration voltage of 15 kV by the ZAF method, which is a kind of energy dispersive X-ray spectroscopy (EDS), using an EDAX analyzer (AMETEK EDAX-VE 9800) attached to the same device; rake faces and flank faces were each measured for the content ratio of Ti, Al, and W; and $W_r$, $W_f$, $Al_r$, and $Al_f$ were calculated. The results were shown in Table 2.

TABLE 2

| Sample No. | Composition | Rake face | | | Flank face | | | | | |
| | | $W_r$ (atomic %) | $Al_r$ (atomic %) | Layer thickness $t_r$ (μm) | $W_f$ (atomic %) | $Al_f$ (atomic %) | Layer thickness $t_f$ (μm) | $W_f/W_r$ | $Al_r/Al_f$ | $t_r/t_f$ |
|---|---|---|---|---|---|---|---|---|---|---|
| I-1 | $Ti_{0.47}Al_{0.50}W_{0.03}N$ | 0.0276 | 0.504 | 2.3 | 0.0493 | 0.488 | 3.5 | 1.79 | 1.03 | 0.66 |
| I-2 | $Ti_{0.49}Al_{0.46}W_{0.01}Nb_{0.03}Si_{0.01}N$ | 0.0172 | 0.4548 | 2.3 | 0.0526 | 0.4278 | 4.2 | 3.06 | 1.06 | 0.55 |
| I-3 | $Ti_{0.30}Al_{0.46}Si_{0.12}W_{0.12}N$ | 0.122 | 0.455 | 2.2 | 0.178 | 0.451 | 5.5 | 1.46 | 1.01 | 0.40 |
| I-4 | $Ti_{0.38}Al_{0.49}W_{0.06}Mo_{0.07}N$ | 0.0596 | 0.491 | 1.8 | 0.188 | 0.472 | 4.0 | 3.15 | 1.04 | 0.45 |
| I-5 | $Ti_{0.30}Al_{0.51}Cr_{0.09}W_{0.10}N$ | 0.0108 | 0.513 | 2.5 | 0.0183 | 0.468 | 3.0 | 1.69 | 1.10 | 0.83 |
| I-6 | $Ti_{0.43}Al_{0.48}W_{0.09}N$ | 0.092 | 0.335 | 1.6 | 0.321 | 0.347 | 1.8 | 3.49 | 0.97 | 0.89 |
| I-7 | $Ti_{0.50}Al_{0.41}W_{0.07}Nb_{0.02}N$ | 0.064 | 0.512 | 3.7 | 0.064 | 0.507 | 4.4 | 1.00 | 1.01 | 0.84 |
| I-8 | $Ti_{0.46}Al_{0.54}N$ | — | 0.540 | 3.1 | — | 0.485 | 5.5 | — | 1.11 | 0.56 |
| I-9 | $Ti_{0.40}Al_{0.48}W_{0.12}N$ | 0.121 | 0.498 | 2.5 | 0.120 | 0.494 | 3.2 | 0.99 | 1.01 | 0.78 |

Ten droplets on each rake or flank face, having a diameter of 3 μm or more were selected in descending order. The composition of each droplet was measured, whereby the content ratio of W therein was determined. The average of the W content ratios of the ten droplets was calculated. An element unmeasurable by this method was measured in such a manner that a measurement region, a square of about 200×200 μm, was irradiated with an X-ray from monochrome AlK (200 μm, 35 W, 15 kV) using an X-ray photoelectron spectrometer (Quantum 2000) manufactured by PHI corporation. In order to compare the abundance proportion of the droplets on the rake face to the abundance proportion of the droplets on the flank face, only droplets having a diameter of 1 μm or more were selected and the area occupied by these droplets with respect to the whole surface of the coating layer and the average diameter of these droplets were measured. The results were shown in Table 3.

Furthermore, a cutting test was performed under cutting conditions below using the obtained inserts. The results were shown in Table a Cutting method: shouldering cut (milling)
Work: SKD11
Cutting speed: 150 m/minute
Feeding rate: 0.12 mm/tooth
Depth of cut
  Radial depth of cut: 10 mm
  Axial depth of cut: 3 mm
Cutting condition: dry
Evaluation method: After cutting for 10 minutes, the wear of a flank face and the chipping of a cutting edge are measured.

TABLE 3

| Sample No. | Surface droplets (rake face) | | | Surface droplets (flank face) | | | Width of flank wear (mm) | Cutting edge condition |
|---|---|---|---|---|---|---|---|---|
| | Content ratio (area %) | Average diameter $w_r$ (μm) | W content (atomic %) | Content ratio (area %) | Average diameter $w_r$ (μm) | W content (atomic %) | | |
| I-1 | 16.3 | 1.35 | 3.5 | 10.3 | 0.71 | 2.2 | 0.021 | Steady wear |
| I-2 | 7.8 | 0.82 | 1.9 | 5.3 | 0.73 | 1.6 | 0.012 | Steady wear |
| I-3 | 27.3 | 1.82 | 15.3 | 26.8 | 0.71 | 15.4 | 0.016 | Slight chipping |
| I-4 | 7.6 | 0.93 | 6.2 | 5.8 | 0.76 | 4.7 | 0.018 | Steady wear |
| I-5 | 17.8 | 1.29 | 9.4 | 15.0 | 0.78 | 7.7 | 0.027 | Steady wear |
| I-6 | 9.9 | 1.42 | 11.7 | 10.2 | 0.75 | 11.8 | 0.032 | Welding |
| I-7 | 6.9 | 1.00 | 6.1 | 5.2 | 0.71 | 5.3 | 0.098 | Serious chipping |
| I-8 | 10.4 | 1.14 | — | 9.2 | 0.79 | — | 0.121 | Serious chipping |
| I-9 | 15.5 | 1.39 | 10.3 | 8.9 | 0.73 | 8.2 | 0.118 | Abnormal wear |

According to Tables 1 to 3, Sample Nos. I-7 to I-9, in which the ratio of W at a flank face is less than or equal to that at a rake face, are quickly chipped or worn and therefore have a short tool life.

In contrast, Sample Nos. I-1 to I-6, in which the ratio of W at a flank face is greater than that at a rake face, have good chipping resistance, wear resistance, and cutting performance.

Example 2

Coating layers shown in Table 4 were formed using the cutting insert substrates prepared in Example 1 in the similar manner as that described in Example 1 except that two of three types of targets shown in Table 4 were attached to a side wall and the other one was attached to an upper wall. Main targets used were sintered targets and were each attached to a side wall of a chamber. Sub-targets used were alloy targets or sintered targets containing metals shown in Table 4 and were each set at a corresponding one of set positions on a wall of the chamber as shown in Table 4.

TABLE 4

| Sample No. | Targets | | | | Deposition Condition Bias voltage (V) |
|---|---|---|---|---|---|
| | Main target 1[1)] | Main target 2[1)] | Sub-target | Set position | |
| II-1 | TiAlW | TiAl | W (Alloy) | Upper wall (T1 side) | 50 |
| II-2 | TiAlNbSi | TiAl | TiW (Alloy) | Upper wall (T1 side) | 35 |
| II-3 | TiAlSi | TiAl | TiW (Sintered) | Upper wall (T2 side) | 150 |
| II-4 | TiAlMo | TiAl | W (Alloy) | Upper wall (T2 side) | 75 |
| II-5 | TiAlCr | TiAl | TiW (Alloy) | Upper wall (T1 side) | 100 |
| II-6 | TiAl | TiAl | W (Sintered) | Upper wall (T1 side) | 75 |

[1)]All main targets were set on a side wall of a chamber.

For obtained inserts, in the same manner as that described in Example 1, an quantitative analysis of the shape of crystals constituting the coating layers, the thickness ($t_r$, $t_f$), and the composition of the coating layers were performed; rake faces and flank faces were measured for the content ratio of Ti, Al, and W; and $W_r$, $W_f$, $Al_r$, and $Al_f$ were calculated. The results were shown in Table 5. As each coating layer was observed with a transmission electron microscope (TEM), a configuration of a first layer (upper stage) and second layer (lower stage), which were stacked with a distance of a thickness of 10 nm or less, having a composition (detail) shown in Table 5 was found. The average of the W content ratios of droplets, the area occupied by the droplets with respect to the whole surface of the coating layer, and the average particle diameter were measured in the same manner as that described in Example 1 and were specified in Table 6. Furthermore, a cutting test was performed under the same cutting conditions as those described in Example 1 using the obtained inserts. The results were shown in Table 7.

TABLE 5

| Sample No. | Composition (whole) | Composition (detail) | Rake face $W_r$ (atomic %) | $Al_r$ (atomic %) | Layer thickness $t_r$ (μm) |
|---|---|---|---|---|---|
| II-1 | $Ti_{0.48}Al_{0.50}W_{0.02}N$ | $Ti_{0.47}Al_{0.50}W_{0.03}N$ $Ti_{0.50}Al_{0.50}N$ | 0.0186 | 0.511 | 2.8 |
| II-2 | $Ti_{0.39}Al_{0.50}W_{0.095}Nb_{0.01}Si_{0.005}N$ | $Ti_{0.49}Al_{0.46}W_{0.01}Nb_{0.03}Si_{0.01}N$ $Ti_{0.30}Al_{0.70}N$ | 0.0145 | 0.556 | 2.5 |
| II-3 | $Ti_{0.40}Al_{0.48}Si_{0.05}W_{0.07}N$ | $Ti_{0.35}Al_{0.51}Si_{0.12}W_{0.02}N$ $Ti_{0.35}Al_{0.54}W_{0.11}N$ | 0.119 | 0.479 | 2.3 |
| II-4 | $Ti_{0.38}Al_{0.43}W_{0.12}Mo_{0.07}N$ | $Ti_{0.42}Al_{0.50}W_{0.01}Mo_{0.07}N$ $Ti_{0.40}Al_{0.40}W_{0.20}N$ | 0.0592 | 0.487 | 2.0 |
| II-5 | $Ti_{0.34}Al_{0.53}Cr_{0.05}W_{0.08}N$ | $Ti_{0.30}Al_{0.51}Cr_{0.09}W_{0.10}N$ $Ti_{0.50}Al_{0.30}Cr_{0.20}N$ | 0.0101 | 0.527 | 2.5 |
| II-6 | $Ti_{0.43}Al_{0.51}W_{0.06}N$ | $Ti_{0.43}Al_{0.48}W_{0.09}N$ $Ti_{0.40}Al_{0.60}N$ | 0.088 | 0.510 | 1.7 |

TABLE 6

| Sample No. | Flank face $W_f$ (atomic %) | $Al_f$ (atomic %) | Layer thickness $t_f$ (μm) | $W_f/W_r$ | $Al_f/Al_r$ | $t_r/t_f$ |
|---|---|---|---|---|---|---|
| II-1 | 0.0193 | 0.482 | 3.4 | 1.04 | 1.06 | 0.82 |
| II-2 | 0.0222 | 0.528 | 4.0 | 1.53 | 1.05 | 0.63 |
| II-3 | 0.181 | 0.464 | 5.3 | 1.52 | 1.03 | 0.43 |
| II-4 | 0.083 | 0.472 | 4.0 | 1.40 | 1.03 | 0.50 |
| II-5 | 0.0134 | 0.518 | 2.9 | 1.33 | 1.02 | 0.86 |
| II-6 | 0.126 | 0.504 | 1.6 | 1.43 | 1.01 | 1.06 |

TABLE 7

| Sample No. | Surface droplets (rake face) | | | Surface droplets (flank face) | | | Width of flank wear (mm) | Cutting edge condition |
|---|---|---|---|---|---|---|---|---|
| | Content (area %) | Average diameter $w_r$ (μm) | W content (atomic %) | Content (area %) | Average diameter $w_r$ (μm) | W content (atomic %) | | |
| II-1 | 16.0 | 1.26 | 2.9 | 10.0 | 0.69 | 2.2 | 0.020 | Steady wear |
| II-2 | 8.5 | 0.85 | 1.9 | 5.1 | 0.71 | 1.5 | 0.011 | Steady wear |
| II-3 | 25.7 | 1.93 | 15.3 | 26.5 | 0.70 | 15.2 | 0.013 | Slight chipping |
| II-4 | 7.9 | 0.85 | 6.2 | 5.9 | 0.73 | 4.6 | 0.017 | Steady wear |
| II-5 | 19.1 | 1.18 | 9.4 | 15.4 | 0.77 | 7.8 | 0.026 | Steady wear |
| II-6 | 10.5 | 1.41 | 11.7 | 10.5 | 0.74 | 11.5 | 0.030 | Welding |

According to Tables 4 to 7, Sample Nos. II-1 to II-6, in which the ratio of W at a flank face is greater than that at a rake face, have good chipping resistance, wear resistance, and cutting performance.

What is claimed is:

1. A cutting tool comprising:
   a cutting tool substrate provided with a rake face and a flank face; and
   a coating layer that is formed on a surface of the rake face and the flank face;
   wherein
   the coating layer is represented by $Ti_{1-a-b-c}Al_aW_bM_c(C_{1-x}N_x)$, M being selected as at least one from the group consisting of Si, Y, Group-IV, V, and VI metals, excluding Ti and W, in the periodic table; wherein
   the content correlations measured in a molar fraction are $0.3 \leq a \leq 0.6$; $0.01 \leq b \leq 0.2$; $0 \leq c \leq 0.2$; and $0 \leq x \leq 1$, and a content of W in the coating layer at the flank face is higher than the content of W at the rake face; and
   the coating layer comprises droplets thereon, and the content of W in the droplets at the flank face is lower than the content of W in the droplets at the rake face.

2. The cutting tool according to claim 1, wherein $W_f/W_r$ is 1.5 to 3.2, where $W_r$ is a ratio of an amount of W to a total amount of Ti and Al in the coating layer at the rake face and $W_f$ is the ratio of the amount of W to the total amount of Ti and Al in the coating layer at the flank face.

3. The cutting tool according to claim 1, wherein $Al_r/Al_f$ is 1.03 to 1.1, where $Al_r$ is a ratio of an amount of Al to the total amount of Ti and Al in the coating layer at the rake face and $Al_f$ is the ratio of the amount of Al to the total amount of Ti and Al in the coating layer at the flank face.

4. The cutting tool according to claim 1, wherein the thickness of the coating layer at the flank face is larger than the thickness of the coating layer at the rake face.

5. The cutting tool according to claim 1, wherein the coating layer has a configuration in which first coating layers represented by $Ti_{1-a1-b1-c1}Al_{a1}W_{b1}M_{c1}(C_{1-x1}N_{x1})$, where $0 \leq a1 \leq 0.8$, $0 \leq b1 \leq 0.2$, $0 \leq c1 \leq 0.2$, $0 \leq x1 \leq 1$) and second coating layers represented by $Ti_{1-a2-b2-c2}Al_{a2}W_{b2}M_{c2}(C_{1-x2}N_{x2})$, where $0 \leq a2 \leq 0.8$, $0 \leq b2 \leq 0.2$, $0 \leq c2 \leq 0.2$, and $0 \leq x2 \leq 1$, with at least one of the conditions $a1 \neq a2$, $b1 \neq b2$ and $c1 \neq c2$ being fulfilled, wherein the first layers and the second layers are alternately stacked, and the number of the first and second coating layers being ten or more.

6. The cutting tool according to claim 1, $0.3 \leq a2 \leq 0.8$, $b2=0$, $c2=0$ and $0 \leq x2 \leq 1$), with at least one of the conditions $a1 \neq a2$, $b1 \neq b2$ and $c1 \neq c2$ being fulfilled.

* * * * *